(12) United States Patent
Reis

(10) Patent No.: US 7,795,981 B2
(45) Date of Patent: Sep. 14, 2010

(54) LOW NOISE AMPLIFIER

(75) Inventor: Ricardo dos Santos Reis, Turcifal (PT)

(73) Assignee: Synopsys, Inc., Mountain View, CA (US)

( * ) Notice: Subject to any disclaimer, the term of this patent is extended or adjusted under 35 U.S.C. 154(b) by 1 day.

(21) Appl. No.: 11/968,103

(22) Filed: Dec. 31, 2007

(65) Prior Publication Data
US 2009/0167440 A1    Jul. 2, 2009

(51) Int. Cl.
*H03F 3/04* (2006.01)
(52) U.S. Cl. .......................................... 330/311; 330/85
(58) Field of Classification Search ............... 330/310, 330/311, 144, 284, 85–86
See application file for complete search history.

(56) References Cited

U.S. PATENT DOCUMENTS

| 6,982,610 B2 * | 1/2006 | Govind ........................ 333/32 |
| 7,292,097 B2 * | 11/2007 | Taylor ......................... 330/98 |
| 7,352,247 B2 * | 4/2008 | Oh et al. ..................... 330/311 |
| 7,474,158 B1 * | 1/2009 | Yim et al. ................... 330/311 |

* cited by examiner

*Primary Examiner*—Robert Pascal
*Assistant Examiner*—Khiem D Nguyen
(74) *Attorney, Agent, or Firm*—Bever, Hoffman & Harms, LLP; Jeanette S. Harms

(57) ABSTRACT

The invention teaches an amplifier (100) with an input signal (IN) coupled to the gate of a second transistor (Q2) and an output signal (OUT) coupled to an output node between a third resistor (R3) and the drain of the second transistor (Q2). A third transistor (Q3) is coupled in parallel between the output node and the gate of a second transistor (Q2). A first bias signal (Vbias) is coupled to the output node and the gate of the third transistor (Q3). The amplifier preferably also includes a plurality of switchable resistors coupled to the output node to adjust the output for process variations.

The invention also describes a method of compensating for process variations in an output of an amplifier which comprises producing a reference signal dependent on the difference between a reference value and an actual value and switching one or more resistors into the output of the amplifier to adjust the output of the amplifier to reflect the process variations. The reference signal is produced by comparing the differential inputs of a reference input produced from a reference potential across a first resistor 302 having a reference value in series with a constant current source 304 and an actual input produced from an actual potential across a second resistor 303 having substantially the same reference value. The second resistor 303 is in series with the channel of a transistor 301.

11 Claims, 1 Drawing Sheet

US 7,795,981 B2

LOW NOISE AMPLIFIER

TECHNICAL FIELD OF THE INVENTION

The invention relates to an amplifier (LNA) such as a low noise amplifier.

BACKGROUND OF THE INVENTION

A low noise amplifier (LNA) is a type of electronic amplifier used in communication systems to amplify very weak signals captured by an antenna.

One of the known issues with the prior art low noise amplifiers is to ensure that the low noise amplifiers have sufficient headroom at the output to ensure that an amplified input signal is not saturated at the output. In the prior art this can be achieved by providing a bank of selectable resistors between an output node and a voltage supply. One or more resistors can be selected in order to ensure that an output signal at the output node is not saturated.

SUMMARY OF THE INVENTION

The invention discloses an amplifier with an input coupled to the gate of a second transistor and an output coupled to an output node between a third resistor and the drain of the second transistor. A third transistor is coupled in parallel between the output node and the gate of a second transistor and a bias signal coupled to the output node and to the gate of the third transistor.

In one aspect of the invention, a plurality of switchable resistors is coupled to the output node. The plurality of switchable resistors receive a signal from a calibration circuit to select ones of the switchable resistors across which an adjusted output is generated. This allows fine calibration of the circuit to take into account process variations. The calibration circuit comprises in one aspect of the invention a first calibration resistor in series with a second constant current source, a second calibration resistor in series with the drain of a calibration transistor and a differential amplifier adapted to measure the difference in potentials across the first calibration resistor and the second calibration resistor.

The invention also includes a method of compensating for process variations in a gain of an amplifier. In the method, a reference signal is produced whose value is dependent on the difference between a reference value and an actual value. The reference signal is used to switch one or more resistors into an output path of the amplifier to adjust the gain of the amplifier to reflect the process variations.

In one example of the invention, the reference signal is produced by comparing a reference input produced from a reference potential measured across a first resistor having a reference value, the first resistor being in series with a constant current source, and an actual input produced from an actual potential measured across a second resistor having substantially the same reference value as the first resistor, the second resistor being in series with the channel of a transistor.

It is also possible to produce a plurality of reference signals and using the plurality of reference signals to switch the one or more resistors into the output path of the amplifier.

DETAILED DESCRIPTION OF THE PREFERRED EMBODIMENTS OF THE INVENTION

Figure 1:
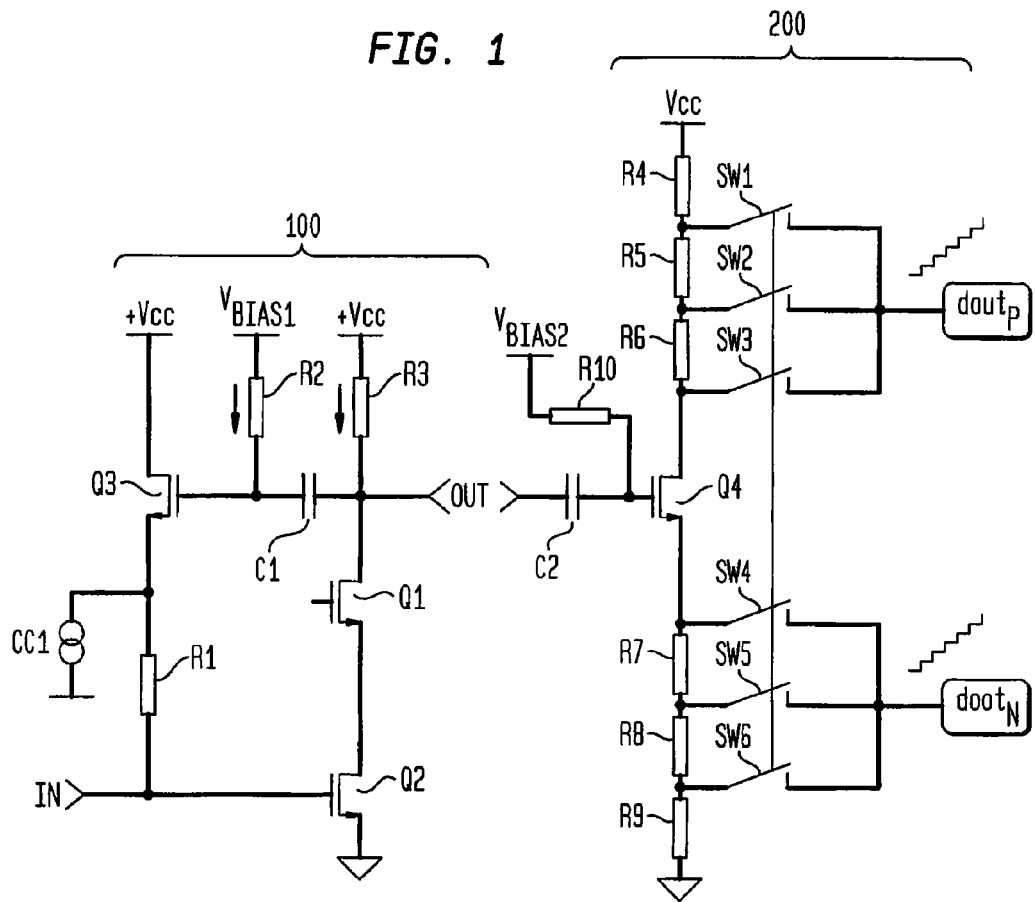
FIG. 1 illustrates a low noise amplifier according to an aspect of the invention.

FIG. 1 illustrates an example of a low noise amplifier 100 and a conversion stage 200 according to an aspect of the invention. The low noise amplifier 100 of FIG. 1 is an example of a common-source amplifier in which the input signal IN is applied to the gate of a second transistor Q2 to control the signal-drain current. The output signal OUT is sensed across a third resistor R3 which is connected between a supply voltage Vcc and the drain of the transistor Q2. The third resistor R3 can be replaced by a bank of resistors which can be selected and act as a coarse gain for the low noise amplifier 10. Typically the selection of the resistors allows the course gain to be selected in steps of 6 dB, but this is not limiting of the invention. A first transistor Q1 is placed between the third resistor R3 and the drain of the second transistor Q2. The first transistor Q1 is a cascade transistor as known in the art and is used to isolate parasitic capacitance associated with the second transistor Q2 from the output signal OUT. The first transistor Q1 is biased to Vdd (which is around 1.8V in this non-limiting example) or to another DC value (e.g around 1.6 V in a non-limiting example) f.

In the aspect of the invention shown in FIG. 1, the output signal OUT is also applied to a first side of a first capacitor C1. A second side of the first capacitor C1 is connected to the gate of a third transistor Q3 and to a second resistor R2. The resistor R2 is connected between a first biasing voltage Vbias and the second side of the first capacitor C1. In a non-limiting example of the invention, the first biasing voltage Vbias is around 1.4 V (Vdd would be around 1.8 V). The source of the third transistor Q3 is connected through a resistor R1 to the input signal IN as well as to a constant current source CC1.

The addition of the third transistor Q3 together with the second resistor R2 and the constant current source CC1 allows the bias of Q3 to be adjusted by changing the value of the first bias voltage Vbias. This changes the drain current through the third transistor Q3 (and thus through the first resistor R1) which results in a change the bias of the second transistor Q2. As a result the level of the output signal OUT is changed to ensure that the output signal OUT does not become saturated. This improves the headroom of the low noise amplifier.

In one example of the invention, the input impedance of the low noise amplifier (determined by the first resistor, the third transistor Q3 and the constant current source CC1) is set to be 50 Ohm, but this is not limiting of the invention. The value of R1 must be such that R1/(Gain+1)=50 Ohms in this example.

FIG. 1 also shows the conversion stage 200 which is used to convert the output signal OUT from the low noise amplifier 100 which is a single ended signal to a differential signal for further processing in the circuit. The conversion stage 200 includes a fourth transistor Q4 connected to the output node of the low noise amplifier 100 and coupled by a second capacitor C2. A second bias voltage Vbias2 is connected to the gate of Q4 through a tenth resistor R10 to bias the fourth transistor Q4. The second biasing voltage would be typically around 1.6V.

A first bank of switchable resistors R4-R6 is connected to the drain of the fourth transistor Q4. Similarly a second bank of switchable resistor R7-R9 is connected to the source of the fourth transistor Q4. A first plurality of switches SW1-SW3 can switch ones of the first bank of switchable resistors R4-R6 to an output node doutp. A second plurality of switches SW4-

SW5 can switch ones of the second bank of switchable resistors R7-R9 to an output node doutn. The first bank of switchable resistors R4-R6 and the second bank of switchable resistors R7-R9 act together as a fine gain for the low noise amplifier 100. Typically the fine gain is in steps of 2 dB, but this is not limiting of the invention.

It will be appreciated that the switches SW3 and SW4, SW5 and SW2 as well as SW1 and SW6 will always be switched as pairs (i.e. switch SW3 is switches at the same time as SW4, etc.). This is because the conversion stage produces the differential signal and the impedance on both lines must be substantially the same. The different signal is output at the output node doutp or the output node doutn.

Figure 2:
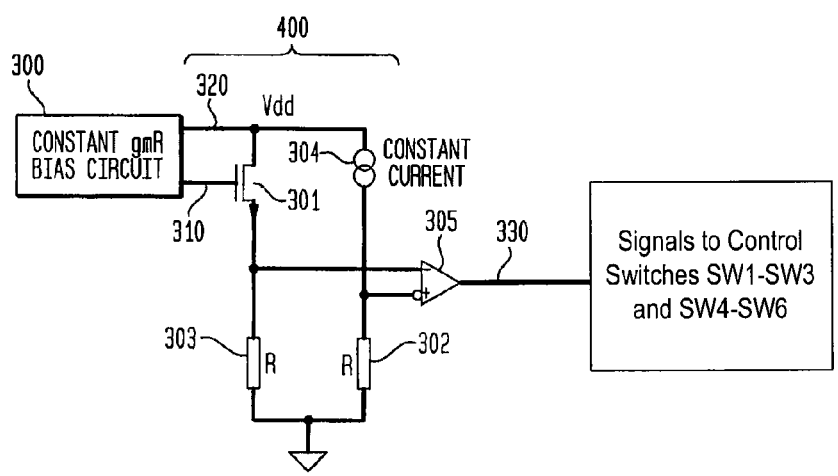
FIG. 2 illustrates a calibration circuit according to an aspect of the invention.

The first plurality of switches SW1-SW3 and the second plurality of switches SW4-SW6 are switched in this aspect of the invention by a calibration circuit 400 as shown in FIG. 2 in order to switch in and out the appropriate ones of the first bank of resistors R4-R6 and/or the appropriate ones of the second bank of resistors R7-R9 to control the fine gain. It should be noted that this example is shown with two pluralities of three switches SW1 to SW3 and SW4 to SW6 with two sets of switchable resistors R4-R6 and R7-R9. This example is not limiting of the invention and other numbers of resistors may be chosen.

The calibration circuit 400 comprises a constant gmR bias circuit 300 with a supply line 320 set at Vdd and an output 320 which biases the gate of a test transistor 301. The test transistor 301 is matched with a transistor within the constant gmR bias circuit 300. The supply line 320 is connected to the drain of the test transistor 301 and also to a constant current source 304. The output 320 biases the gate of the test transistor 301 such that the current passing though the drain is proportional to the current generated by the constant gmR bias circuit 300. A first calibration resistor 302 is connected between ground and the other side of the constant current source 304. A second calibration resistor 303 is connected between the drain of the test transistor 301 and ground. The value of the first resistor 302 and the second resistor 303 are substantially the same. Since both of the first calibration resistor 302 and the second calibration resistor 303 are placed substantially close to each other on the chip surface, any difference in process parameters between the first calibration resistor 302 and the second calibration resistor 303 are substantially eliminated.

The difference in potential across the first calibration resistor 302 and the second calibration resistor 303 is measured in a differential amplifier 305 which produces an output 330 which is dependent on the difference in the potentials across the first calibration resistor 302 and the second calibration resistor 302. Since the constant current source 304 produces a constant current this output 330 is dependent on processing variations in the test transistor 301. The output 330 can be used to switch the first plurality of switches SW1-SW3 and/or the second plurality of switches SW4-SW6 using associated logic.

In a further aspect of the invention, the first calibration resistor 302 and the second calibration resistor 303 are each formed from a bank of resistors connected in series. A plurality of differential amplifiers 305 taps the bank of resistors at appropriate points and produces a plurality of outputs 330. The plurality of outputs 330 are then used to switch the first plurality of switches SW1-SW3 and the second plurality of switches SW4-SW6. It will be appreciated that in the example shown in FIG. 1, only two differential amplifiers need to be present in order to switch the three pairs of switches and thus control the fine gain.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as semiconductor, magnetic disk, optical disk (e.g., CD-ROM, DVD-ROM, etc.). Embodiments of the present invention may include methods of providing an apparatus described herein by providing software describing the apparatus and subsequently transmitting the software as a computer data signal over a communication network including the Internet and intranets.

It is understood that the apparatus and method embodiments described herein may be included in a semiconductor intellectual property core, (e.g., embodied in HDL) and transformed to hardware in the production of integrated circuits. Additionally, the apparatus and method embodiments described herein may be embodied as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims. The summary and abstract sections may set forth one or more but not all exemplary embodiments of the present invention.

What is claimed is:

1. An amplifier comprising:
    a first transistor;
    an input node coupled to a gate of the first transistor;
    an output node coupled to a drain of the first transistor;
    a second transistor;
    a capacitor directly coupling the output node with a gate of the second transistor;
    a resistor arranged to couple a voltage source to the output node;
    a bias source coupled to the gate of the second transistor; and
    a constant current source coupled to a source of the second transistor.

2. An amplifier arrangement comprising:
    an amplifier stage having an input node and an output node, the amplifier stage including:
        a first transistor;
        an input node coupled to a gate of the first transistor;
        an output node coupled to a drain of the first transistor;
        a second transistor;
        a capacitor coupling the output node with a gate of the second transistor;
        a resistor arranged to coupled a voltage source to the output node; and a bias source coupled to the gate of the second transistor; and a conversion stage, the conversion stage comprising a plurality of switchable resistors coupled to the output node of the amplifier stage.

3. An amplifier arrangement according to claim 2 wherein the conversion stage further comprises:

a third transistor having a gate coupled to the output node of the amplifier stage and a source-drain channel coupled to one or more of the plurality of switchable resistors.

4. An amplifier arrangement according to claim 3, wherein the switchable resistors are configured and arranged to receive a signal from a calibration circuit to select ones of the switchable resistors across which an adjusted output is generated.

5. An amplifier arrangement according to claim 4, wherein the calibration circuit comprises a first calibration resistor in series with a constant current source, a second calibration resistor in series with a source of a calibration transistor and a differential amplifier adapted to measure a difference in potentials across the first calibration resistor and the second calibration resistor.

6. An amplifier arrangement according to claim 5, wherein the calibration transistor is biased by an output from a constant gmR bias circuit.

7. A method of compensating for a gain of an amplifier different from a desired gain, the method comprising:

producing a reference signal dependent on a difference between a reference value and an actual value; and adjusting the gain of the amplifier by using the reference signal to switch one or more resistors into an output path of the amplifier.

8. The method of claim 7, wherein the reference signal is produced by comparing a reference input produced from a reference potential measured across a first resistor having a reference value, the first resistor being in series with a constant current source, and an actual input produced from an actual potential measured across a second resistor having substantially the reference value, the second resistor being in series with a channel of a transistor.

9. The method of claim 7, further comprising producing a plurality of reference signals and using the plurality of reference signals to switch the one or more resistors into the output path of the amplifier.

10. A method of compensating for a gain of an amplifier different from a desired gain, the method comprising:

producing a reference signal by comparing a reference input produced from a reference potential measured across a first resistor having a reference value, the first resistor being in series with a constant current source, and an actual input produced from an actual potential measured across a second resistor having substantially the reference value, the second resistor being in series with a channel of a transistor; and using the reference signal to switch one or more resistors into an output path of the amplifier to adjust the gain of the amplifier to compensate for its actual gain resulting from process variations.

11. A method of compensating for a gain of an amplifier different from a desired gain, the method comprising:

producing a reference signal dependent on a difference between a reference value and an actual value;

using the reference signal to switch one or more resistors into an output path of the amplifier to adjust the gain of the amplifier to compensate for its actual gain resulting from process variations; and producing a plurality of reference signals and using the plurality of reference signals to switch the one or more resistors into the output path of the amplifier.

* * * * *

UNITED STATES PATENT AND TRADEMARK OFFICE
CERTIFICATE OF CORRECTION

| | | |
|---|---|---|
| PATENT NO. | : 7,795,981 B2 | Page 1 of 1 |
| APPLICATION NO. | : 11/968103 | |
| DATED | : September 14, 2010 | |
| INVENTOR(S) | : Ricardo Dos Santos Reis | |

It is certified that error appears in the above-identified patent and that said Letters Patent is hereby corrected as shown below:

<u>Column 4</u>
Line 66, amend "coupled" to --couple--.

Signed and Sealed this
Thirty-first Day of January, 2012

David J. Kappos
*Director of the United States Patent and Trademark Office*